US008884391B2

(12) United States Patent
Fudaba et al.

(10) Patent No.: US 8,884,391 B2
(45) Date of Patent: Nov. 11, 2014

(54) PHOTOELECTRIC CONVERSION DEVICE AND PHOTOELECTRIC CONVERSION SYSTEM WITH BOUNDARY REGION

(75) Inventors: Tetsuya Fudaba, Ebina (JP); Masatsugu Itahashi, Yokohama (JP); Masahiro Kobayashi, Tokyo (JP); Hideo Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/611,454

(22) Filed: Sep. 12, 2012

(65) Prior Publication Data
US 2013/0082343 A1 Apr. 4, 2013

(30) Foreign Application Priority Data

Oct. 4, 2011 (JP) ................................. 2011-220531
Sep. 5, 2012 (JP) ................................. 2012-195501

(51) Int. Cl.
H01L 31/0232 (2014.01)
H01L 27/146 (2006.01)
H01L 31/055 (2014.01)
H01L 31/0236 (2006.01)
H01L 25/04 (2014.01)

(52) U.S. Cl.
CPC ........... *H01L 31/02327* (2013.01); *Y02E 10/50* (2013.01); *H01L 27/14647* (2013.01); *H01L 31/055* (2013.01); *H01L 31/0236* (2013.01); *H01L 27/1464* (2013.01); *H01L 25/045* (2013.01); *H01L 27/1452* (2013.01)
USPC ............ 257/432; 257/436; 257/443; 438/432

(58) Field of Classification Search
CPC ... H01L 31/0236; H01L 27/146; H01L 31/18; H01L 25/045; H01L 31/02327; H01L 27/1462; H01L 27/1464; H01L 27/14647; H01L 31/055; Y02E 10/50

USPC .......... 438/432, 436, 443, E31.054, E31.001, 438/71; 257/432, 436, 443, E31.054, 257/E31.001, E31.13, E27.134

See application file for complete search history.

(56) References Cited

U.S. PATENT DOCUMENTS 7,208,811 B2 * 4/2007 Tamai .......................... 257/461
7,462,810 B2   12/2008 Kobayashi et al.
7,847,362 B2 * 12/2010 Ogino et al. ................. 257/436

(Continued)

FOREIGN PATENT DOCUMENTS

JP   2008-500768 A    1/2008
JP   2009-038352 A    2/2009
WO   WO 2005/120048 A1   12/2005

*Primary Examiner* — Caleb Henry
(74) *Attorney, Agent, or Firm* — Fitzpatrick, Cella, Harper & Scinto

(57) ABSTRACT

One of disclosed embodiments provides a photoelectric conversion device, comprising a member including a first surface configured to receive light, and a second surface opposite to the first surface, and a plurality of photoelectric conversion portions aligned inside the member in a depth direction from the first surface, wherein at least one of the plurality of photoelectric conversion portions other than the photoelectric conversion portion positioned closest to the first surface includes, on a boundary surface thereof with the member, unevenness having a difference in level larger than a difference in level of unevenness of the photoelectric conversion portion positioned closest to the first surface, and wherein the boundary surface having the unevenness is configured to localize or resonate light incident on the member from a side of the first surface around the boundary surface having the unevenness.

9 Claims, 4 Drawing Sheets

(56) References Cited

U.S. PATENT DOCUMENTS

| | | | |
|---|---|---|---|
| 7,920,192 B2 | 4/2011 | Watanabe et al. | |
| 7,928,477 B2 | 4/2011 | Kobayashi et al. | |
| 7,935,995 B2 | 5/2011 | Watanabe et al. | |
| 7,990,440 B2 | 8/2011 | Kobayashi et al. | |
| 8,013,409 B2 | 9/2011 | Itahashi | |
| 8,045,034 B2 | 10/2011 | Shibata et al. | |
| 8,063,351 B2 | 11/2011 | Kobayashi et al. | |
| 8,174,604 B2 | 5/2012 | Shibata et al. | |
| 8,222,682 B2 | 7/2012 | Watanabe et al. | |
| 8,259,206 B1 | 9/2012 | Shibata et al. | |
| 8,289,432 B2 | 10/2012 | Shibata et al. | |
| 8,357,956 B2 | 1/2013 | Kobayashi et al. | |
| 8,513,586 B2 * | 8/2013 | Yamamoto | 250/208.1 |
| 2003/0063204 A1 * | 4/2003 | Suda | 348/272 |
| 2005/0212045 A1 * | 9/2005 | Tamai | 257/347 |
| 2006/0011954 A1 * | 1/2006 | Ueda et al. | 257/291 |
| 2009/0008735 A1 * | 1/2009 | Ogino et al. | 257/436 |
| 2010/0176272 A1 | 7/2010 | Itahashi | |
| 2010/0328302 A1 | 12/2010 | Yamashita et al. | |
| 2011/0003426 A1 | 1/2011 | Watanabe et al. | |
| 2011/0032379 A1 | 2/2011 | Kobayashi et al. | |
| 2011/0155891 A1 * | 6/2011 | Yamamoto | 250/208.1 |
| 2011/0157447 A1 | 6/2011 | Watanabe et al. | |
| 2011/0278438 A1 | 11/2011 | Kobayashi | |
| 2011/0281391 A1 | 11/2011 | Itahashi | |
| 2011/0285892 A1 | 11/2011 | Itahashi | |
| 2012/0073641 A1 * | 3/2012 | Tseng et al. | 136/256 |
| 2012/0175503 A1 | 7/2012 | Kuroda et al. | |
| 2012/0193690 A1 | 8/2012 | Inoue et al. | |
| 2012/0273657 A1 | 11/2012 | Kobayashi | |

* cited by examiner

US 8,884,391 B2

PHOTOELECTRIC CONVERSION DEVICE AND PHOTOELECTRIC CONVERSION SYSTEM WITH BOUNDARY REGION

BACKGROUND OF THE INVENTION

1. Field of the Invention

The present invention relates to a photoelectric conversion device, a method of manufacturing the same, and a photoelectric conversion system.

2. Description of the Related Art

Japanese Patent Laid-Open No. 2008-500768 discloses a photoelectric conversion device which includes a plurality of photoelectric conversion portions aligned in the depth direction within each unit pixel to detect a plurality of colors using this unit pixel. The photoelectric conversion device uses the fact that the absorptivity of a semiconductor substrate for light of each color varies depending on the depth from the surface of the semiconductor substrate.

SUMMARY OF THE INVENTION

An embodiment in accordance with one of the aspects of the present invention provides a photoelectric conversion device, comprising a member including a first surface configured to receive light, and a second surface opposite to the first surface, and a plurality of photoelectric conversion portions aligned inside the member in a depth direction from the first surface, wherein at least one of the plurality of photoelectric conversion portions other than the photoelectric conversion portion positioned closest to the first surface includes, on a boundary surface thereof with the member, unevenness having a difference in level larger than a difference in level of unevenness of the photoelectric conversion portion positioned closest to the first surface, and wherein the boundary surface having the unevenness localizes or resonates light incident on the member from a side of the first surface around the boundary surface having the unevenness.

Further features of the present invention will become apparent from the following description of exemplary embodiments with reference to the attached drawings.

DESCRIPTION OF THE EMBODIMENTS

One of embodiments according to the present invention provides a technique advantageous in improving the light sensitivities of photoelectric conversion portions formed at deep positions in a photoelectric conversion device including a plurality of photoelectric conversion portions aligned in the depth direction.

Because long-wavelength light such as red light may deeply penetrate the substrate, generated charges may scatter into the substrate. This may lead to loss of light sensitivity. Of the plurality of photoelectric conversion portions, a photoelectric conversion portion formed at a deeper position is more likely to suffer loss of light sensitivity. Further, with pixel miniaturization, this adverse effect may become more significant.

<First Embodiment>

Figure 1:
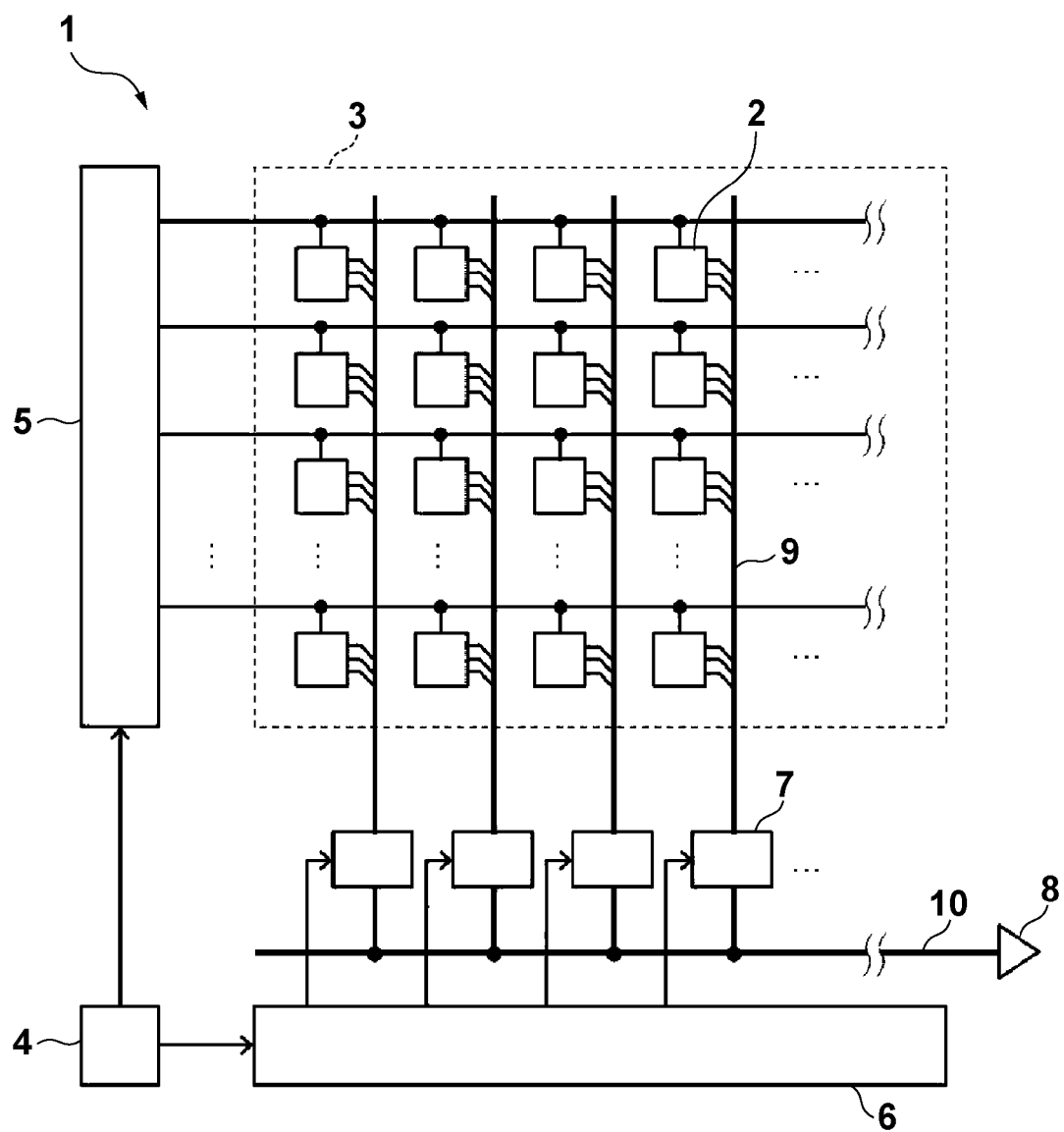
FIG. 1 is a schematic circuit diagram for explaining a photoelectric conversion device according to an embodiment.

The first embodiment will be described with reference to FIGS. 1 and 2. A photoelectric conversion device 1 illustrated in FIG. 1 can be implemented by, for example, a CMOS image sensor. The photoelectric conversion device 1 includes a pixel array 3 formed by arraying a plurality of unit pixels 2, and its peripheral circuit. The peripheral circuit includes a driving control unit 4, vertical scanning circuit 5, horizontal scanning circuit 6, signal detection units 7, and output unit 8. Each of the plurality of unit pixels 2 can include a plurality of photoelectric conversion portions, and detect light beams of a plurality of colors. The case wherein the unit pixel 2 includes three photoelectric conversion portions $20_1$, $20_2$, and $20_3$ (to be described later) which detect light beams of three colors: red, green, and blue, respectively, will be considered in this embodiment. Each of the plurality of unit pixels 2 can output a signal corresponding to the amount of received light of each color to the signal detection unit 7 via a corresponding one of vertical signal lines 9 on respective columns. The driving control unit 4 can control the operations of the vertical scanning circuit 5 and horizontal scanning circuit 6. The vertical scanning circuit 5 can scan for each row the plurality of unit pixels 2 included in the pixel array 3 to issue an instruction to output a signal corresponding to a charge generated by each unit pixel 2. The horizontal scanning circuit 6 can scan the signal detection units 7 for each column to issue an instruction to read out the output from each signal detection unit 7. Each signal detection unit 7 can detect signals output from the unit pixels 2 arranged on a corresponding column to perform processes such as noise removal, signal amplification, and A/D conversion for these signals. The signals processed by the signal detection units 7 can be output to the output unit 8 via horizontal signal lines 10. Upon this operation, light beams of the three colors detected by each unit pixel 2 can be processed as electrical signals, which can be stored in, for example, a storage medium.

The photoelectric conversion device 1 will be described with reference to the cross-sectional structure of the unit pixel 2 illustrated in FIG. 2. The photoelectric conversion device 1 includes a member 50 having a first surface A which receives light via an on-chip lens 140, and a second surface B opposite to the first surface A, and the photoelectric conversion portions $20_1$, $20_2$, and $20_3$ aligned inside the member 50. The member 50 is, for example, a silicon substrate. The photoelectric conversion portions $20_1$, $20_2$, and $20_3$ are, for example, photodiodes. Charges generated by photoelectric conversion are collected or stored in each photoelectric conversion portion 20. The photoelectric conversion portions $20_1$, $20_2$, and $20_3$ can be arranged in the order named from the second surface B toward the first surface A, and the member 50 can be divided into semiconductor regions $30_1$ to $30_3$ in correspondence with the photoelectric conversion portions $20_1$, $20_2$, and $20_3$. That is, the semiconductor region $30_1$ includes the photoelectric conversion portion $20_1$ in its upper portion, the semiconductor region $30_2$ includes the photoelectric conversion portion $20_2$ in its upper portion, and the semiconductor region $30_3$ includes the photoelectric conversion portion $20_3$ in its upper portion. Also, the photoelectric conversion portion $20_1$ has unevenness 40 on its surface on the side of the first surface A, that is, on its boundary surface with the semiconductor region $30_2$.

The unevenness 40 can form a photonic crystal. A photonic crystal can be obtained by alternately, periodically arranging materials having different refractive indices at a period nearly corresponding to the light wavelength. This structure can resonate or spatially localize light to change its property for the light. More specifically, light incident on the boundary surface of this periodic structure can combine and resonate with light within the plane of the boundary surface upon diffraction. The resonating light is localized within the plane of the periodic structure and in its vicinity. Hence, incident light is present near the unevenness 40 for a period of time longer than that in normal state, and is therefore easily absorbed in the photoelectric conversion portion $20_1$. This can produce an effect equivalent to an increase in absorption coefficient of the photoelectric conversion portion $20_1$.

The wavelength (color) of light which undergoes the above-mentioned resonance or localization varies depending on the parameters of the periodic structure, such as the unevenness depth and pitch (interval). Also, examples of a two-dimensional periodic structure which may bring about this phenomenon include a tetragonal lattice, a triangular lattice, and a compound lattice including two or more types of lattices. Examples of the shape of a lattice point include a circle and polygons. The unevenness 40 need only be formed to have a typical depth (difference in level) of, for example, about 100 nm. Also, the pitch (interval) between adjacent convex portions of the unevenness 40 is desirably obtained by multiplying, by a factor that falls within the range of ½ (inclusive) to 1 (inclusive), the wavelength of light (red light in this case) which can be detected by the photoelectric conversion portion $20_1$. However, the absorption efficiency can also be improved when the pitch between adjacent convex portions of the unevenness 40 is obtained by multiplying, by a factor that falls within the range of ¼ (inclusive) to 2 (inclusive), the wavelength of light which can be detected by the photoelectric conversion portion $20_1$. Although the effect of this embodiment can be obtained regardless of the height of the convex portions, the height of the convex portions is desirably smaller than the pitch between adjacent convex portions. Note that the light wavelength used is the wavelength of light to be detected by a photoelectric conversion portion provided with unevenness. The light wavelength used is selected from, for example, the wavelength range (about 400 nm to 700 nm) of visible light. Alternatively, the light wavelength used may be selected from the infrared wavelength range (700 nm or more). The size of the unevenness 40 is preferably set in correspondence especially with light which has wavelengths of 600 nm or more and can hardly be photoelectrically converted at a shallow position.

According to this embodiment, light which impinges on the member 50 from the side of the first surface A and reaches the boundary surface of the unevenness 40 is absorbed in this boundary surface. This means that light is photoelectrically converted at a position closer to the photoelectric conversion portion $20_1$ in the presence of the unevenness 40 than in the absence of the unevenness 40. This can improve the light sensitivity of the photoelectric conversion portion $20_1$. This, in turn, can improve the sensitivity of the photoelectric conversion device 1 to, for example, red light. Also, in this embodiment, no unevenness is formed either in the photoelectric conversion portion $20_2$ or $20_3$. This means that the photoelectric conversion portion $20_2$ has a flat surface on the side of the first surface A, that is, a flat boundary surface with the semiconductor region $30_3$. Also, the photoelectric conversion portion $20_3$ has a flat surface on the side of the first surface A. As no unevenness 40 is formed in the photoelectric conversion portion $20_3$, light beams to reach the photoelectric conversion portions $20_1$ and $20_2$ can be prevented from being attenuated by, for example, the above-mentioned localization in the photoelectric conversion portion $20_3$. Note that the photoelectric conversion portion $20_2$ or $20_3$ may have some unevenness. However, the difference in level of the unevenness 40 of the photoelectric conversion portion $20_1$ is larger than that of the unevenness of the photoelectric conversion portion $20_2$ or $20_3$.

A method of manufacturing a photoelectric conversion device 1 according to this embodiment will be described below. The photoelectric conversion device 1 can be manufactured by a manufacturing method mainly including two steps (first and second steps). In the first step, unevenness 40 is formed on the upper surface of a photoelectric conversion portion $20_1$ formed in a semiconductor region $30_1$. In the second step, a structure 60 including a plurality of photoelectric conversion portions aligned in the height direction is formed on the upper surface of the unevenness 40.

The first step will be described first. First, a photoelectric conversion portion $20_1$ can be formed by, for example, ion implantation of an N-type impurity into a P-type semiconductor region $30_1$. Then, unevenness 40 can be formed on the upper surface of the photoelectric conversion portion $20_1$. The unevenness 40 can be formed by, for example, anisotropic etching using an alkaline solution. Alternatively, the unevenness 40 can be obtained by forming black silicon on the upper surface of the photoelectric conversion portion $20_1$ formed in the semiconductor region $30_1$. The same effect can be achieved using black silicon. Black silicon is a cluster of minute needle-shaped projections of silicon formed using the shallow junction photonics technology. More specifically, black silicon can be formed when energy is locally applied to a silicon surface by laser irradiation to disturb the atomic structure, and then the silicon surface recrystallizes. Black silicon can be obtained by irradiating a silicon surface with, for example, high-intensity pulsed laser light (on the order of femtoseconds) in $SF_6$ gas. As another method of forming black silicon, the black silicon can also be formed by the wet chemical etching method using a nano-catalyst (gold nanoparticles). Black silicon has a visible light absorptivity about twice that of normal silicon, and can detect even infrared light that cannot be detected by normal silicon.

The second step will be described next. In the second step, a structure 60 including a plurality of photoelectric conversion portions aligned in the height direction is formed on the upper surface of the unevenness 40. The structure 60 can be formed by repeating steps of, for example, epitaxial growth and ion implantation. More specifically, a photoelectric conversion portion $20_2$ is formed by, for example, ion implantation of an N-type impurity into a P-type semiconductor region $30_2$ epitaxially grown on the semiconductor region $30_1$. Further, a photoelectric conversion portion $20_3$ is similarly formed in a semiconductor region $30_3$ epitaxially grown on the semiconductor region $30_2$. This can form a structure 60. The structure 60 can also be formed by, for example, growing semiconductor regions $30_2$ and $30_3$ on the semiconductor region $30_1$ at once, and implanting ions into the semiconductor regions $30_2$ and $30_3$ at different intensities to form photoelectric conversion portions $20_2$ and $20_3$. Note that the step of forming unevenness as described above is not performed either for the photoelectric conversion portion $20_2$ or $20_3$. In this manner, in this embodiment, the step of forming unevenness is selectively performed for some of a plurality of photoelectric conversion portions.

In the first and second steps, it is also possible to form photoelectric conversion portions $20_1$ and $20_2$ thicker than a photoelectric conversion portion $20_3$ so as to improve the absorption efficiencies of red light and green light. Also, in the course of the first and second steps, an element such as element isolation 70 may be formed separately. Moreover, in the course of the first and second steps, a layer such as P-type diffusion layer regions $80_1$ and $80_2$ having low impurity concentrations may be formed separately. The diffusion layer regions $80_1$ and $80_2$ can prevent deterioration in impurity concentration distribution, that is, so-called autodoping that occurs upon epitaxial growth of the semiconductor regions $30_2$ and $30_3$. The diffusion layer regions $80_1$ and $80_2$ can also serve as potential barriers which prevent charges generated by the photoelectric conversion portions $20_1$ and $20_2$ from scattering into other photoelectric conversion portions.

After the first and second steps, an oxide film 90a can be formed on the side of a first surface A. Plugs 100 for reading signals corresponding to charges generated by the photoelectric conversion portions $20_1$ to $20_3$, and metal contacts 110 to be electrically connected to the plugs 100 can then be formed. An interlayer dielectric film 120 and an interconnection layer 130 (including vertical signal lines 9 and horizontal signal lines 10 as illustrated in FIG. 1) can be formed. Lastly, an oxide film 90b can be formed on the interlayer dielectric film 120, and an on-chip lens 140 can be formed on it.

Figure 2:
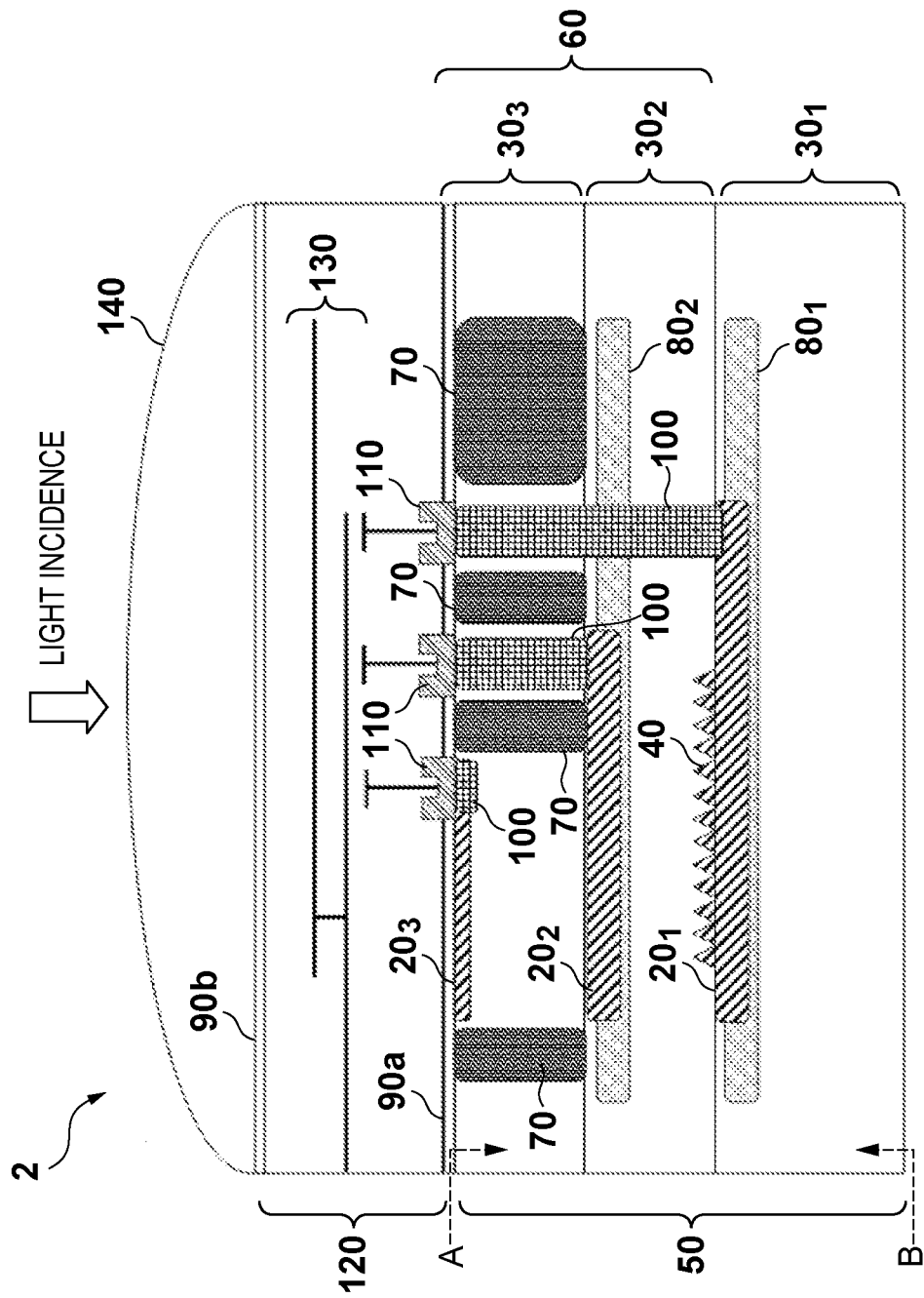
FIG. 2 is a view for explaining the first embodiment.

With the above-mentioned steps, a cross-sectional structure as shown in FIG. 2 is formed. At this time, each of the photoelectric conversion portions $20_1$ to $20_3$ can be formed at a position spaced apart from the first surface A by an appropriate distance so as to absorb light having a desired color (wavelength). For example, the photoelectric conversion portion $20_1$ can be formed at a depth which allows it to absorb red light, the photoelectric conversion portion $20_2$ can be formed at a depth which allows it to absorb green light, and the photoelectric conversion portion $20_3$ can be formed at a depth which allows it to absorb blue light.

As described above, of the plurality of photoelectric conversion portions 20, the photoelectric conversion portion $20_1$ positioned farthest from the first surface A has the unevenness 40 on its upper surface. However, the photoelectric conversion device 1 may include a practically unused, dummy photoelectric conversion portion beneath the photoelectric conversion portion $20_1$. Alternatively, in a photoelectric conversion device which separates two colors on the short- and long-wavelength sides, the photoelectric conversion portion $20_2$ or $20_3$ is often omitted. In this manner, the number of photoelectric conversion portions 20 is not limited to three. Two or more than three photoelectric conversion portions 20 may be formed. Unevenness 40 as mentioned above need only be formed in at least one photoelectric conversion portion, at a position deep from the first surface A, of the plurality of photoelectric conversion portions 20. When, for example, four photoelectric conversion portions 20 are formed, unevenness 40 is formed in at least one of the second to fourth photoelectric conversion portions 20 in ascending order of depth.

Note that in this embodiment, the photoelectric conversion portions $20_2$ and $20_3$ at relatively shallow positions have no photonic crystal structures. Photonic crystal structures may be formed in the photoelectric conversion portions $20_2$ and $20_3$ at relatively shallow positions, in accordance with the required spectroscopic characteristics. Also, when unevenness 40 is formed in each of a plurality of photoelectric conversion portions, the pitch between adjacent convex portions of the unevenness 40 desirably decreases toward the light incident surface (first surface A).

Also, the unevenness 40 according to this embodiment is formed on the boundary surface between the photoelectric conversion portion $20_1$ (N-type semiconductor) and the semiconductor region $30_2$ (P-type semiconductor). These portions having different refractive indices are arranged periodically. However, the difference in refractive index between the photoelectric conversion portion $20_1$ (N-type semiconductor) and the semiconductor region $30_2$ (P-type semiconductor) is small. In contrast to this, the embodiment of the present invention can also be practiced as a modification in which unevenness is formed on the boundary surface between silicon and an insulating layer made of, for example, silicon oxide or silicon nitride having a refractive index higher than silicon. The embodiment of the present invention can moreover be practiced as another modification in which unevenness is formed on the boundary surface between silicon and a gap which is in a vacuum state or filled with a gas. In this manner, unevenness 40 is preferably formed by periodically arranging portions having a large difference in refractive index. In addition, as in this embodiment, it is desired to form unevenness 40 on the boundary surface of the photoelectric conversion portion $20_1$ on the side on which light enters the photoelectric conversion portion $20_1$ (the boundary surface of the photoelectric conversion portion $20_1$ on the side of the first surface A). However, as long as unevenness 40 is formed on the boundary surface of the photoelectric conversion portion $20_1$, the position at which it is formed is not limited, and unevenness may be formed on another boundary surface of the photoelectric conversion portion $20_1$.

<Second Embodiment>

Figure 3:
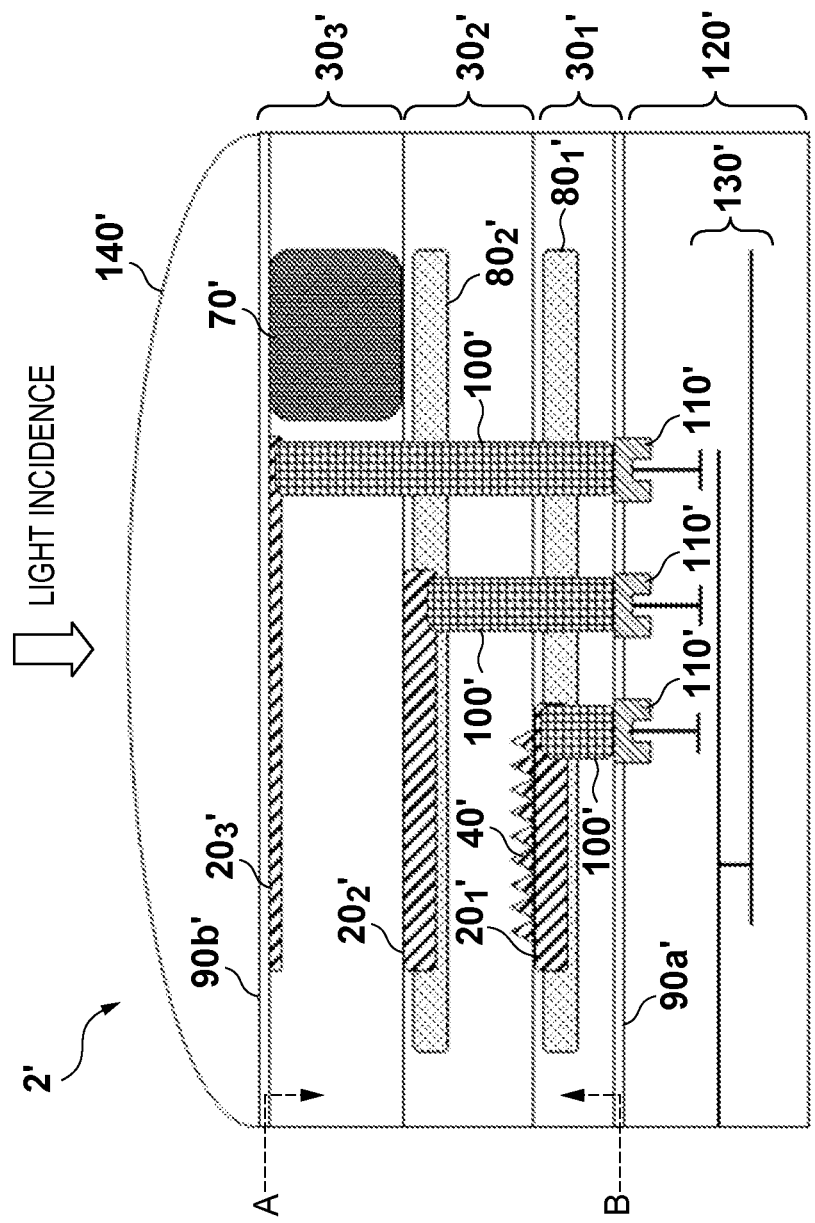
FIG. 3 is a view for explaining the second embodiment.

The second embodiment will be described with reference to FIG. 3. A photoelectric conversion device 1' according to this embodiment includes unit pixels 2' each having a cross-sectional structure as shown in FIG. 3, in place of the unit pixels 2 (FIG. 2). The unit pixels 2 and 2' are different in that the former has the front-side illumination structure, and the latter has the back-side illumination structure. That is, in the photoelectric conversion device 1', a circuit for reading signals generated by photoelectric conversion portions $20_1'$ to $20_3'$ is arranged between the plurality of photoelectric conversion units and the second surface B. The back-side illumination structure can reduce focus loss of light incident on, for example, a metal interconnection. On the other hand, the area of the photoelectric conversion portion 20' may reduce in the order of the photoelectric conversion portions $20_1'$ to $20_3'$ from a first surface A to the second surface B due to structural factors. That is, the photoelectric conversion portion $20_2'$ which detects light having a maximum wavelength (red light in this case) may have a minimum area. Hence, it is harder for the back-side illumination structure than for the front-side illumination structure to obtain a given sensitivity to long-wavelength light. However, as the photoelectric conversion portion $20_2'$ has unevenness 40' on its surface on the side of the first surface A, the same effect as in the first embodiment can be obtained, thereby solving the above-mentioned problem.

A method of manufacturing a photoelectric conversion device 1' will be described below. The photoelectric conversion device 1' can be manufactured by a manufacturing method including first and second steps, in the same way as in the first embodiment. In the first and second steps, as in the first embodiment, it is also possible to form photoelectric conversion portions $20_2'$ and $20_2'$ thicker than a photoelectric conversion portion $20_3'$. Also, in the course of the first and second steps, an element and layer such as element isolation 70' and P-type diffusion layer regions $80_2'$ and $80_2'$ having high impurity concentrations may be formed separately in the same way as in the first embodiment.

After the first and second steps, the wafer is turned over using a separately prepared, support substrate (not shown) to polish the surface of a semiconductor region $30_1'$ (its surface on the side of the second surface B), and an oxide film 90a' can be formed it. Plugs 100' for reading signals corresponding to charges generated by the photoelectric conversion portions $20_1'$ to $20_3'$, and metal contacts 110' to be electrically connected to the plugs 100' can then be formed. An interlayer dielectric film 120' and an interconnection layer 130' (including vertical signal lines 9 and horizontal signal lines 10 as illustrated in FIG. 1) can be formed. Lastly, after the wafer is turned over using the support substrate (not shown) again, an oxide film 90b' can be formed on the upper surface of the photoelectric conversion portion $20_3'$, and an on-chip lens 140' can be formed on it.

With the above-mentioned steps, a cross-sectional structure as shown in FIG. 3 is formed. At this time, each of the photoelectric conversion portions $20_1'$ to $20_3'$ can be formed at a position spaced apart from the first surface A by an appropriate distance so as to absorb light having a desired color (wavelength), in the same way as in the first embodiment.

Although two embodiments have been described above, the present invention is no limited to these embodiments, and its object, state, practical application, function, and other specifications can be changed as needed, so the present invention can also be practiced as other embodiments, as a matter of course. As an example, although each unit pixel includes three photoelectric conversion portions to detect light beams of three colors (red, green, and blue) in each of the above-mentioned embodiments, another embodiment of the present invention comprises pixels, each pixel including two photoelectric conversion portions to detect light beams of two colors (for example, on the short- and long-wavelength sides). In this case, the effect of this embodiment can be obtained when unevenness is applied to the lower photoelectric conversion portion of the two photoelectric conversion portions. As another example, although the photoelectric conversion device is implemented by a CMOS image sensor in each of the above-mentioned embodiments, another embodiment of the present invention provides a photoelectric conversion device implemented by a CCD image sensor.

Figure 4:
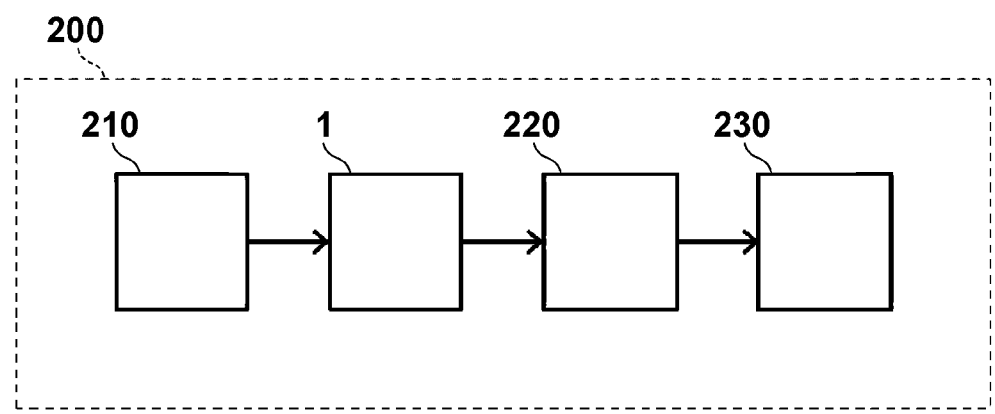
FIG. 4 is a block diagram for explaining an example of a photoelectric conversion system which uses a photoelectric conversion device according to an embodiment.

FIG. 4 is a block diagram for explaining a photoelectric conversion system 200 to which a photoelectric conversion device according to an embodiment of the present invention is applied. The photoelectric conversion system 200 can include a photoelectric conversion device 1, optical system 210, signal processor 220, and storage medium 230. The optical system 210 can include a shutter, lens, and stop, and form an image on the imaging surface of the photoelectric conversion device 1. The signal processor 220 can include, for example, an A/D converter, and a processor which processes digital data output from the A/D converter. The signal processor 220 can generate image data by, for example, a gain adjustment process for a signal output from the photoelectric conversion device 1, a correction process for deterioration in signal due to noise or damage, a color correction process, and a development process. The image data generated by the signal processor 220 can be stored in the storage medium 230. The storage medium 230 can have an appropriate storage capacity. Hence, the photoelectric conversion system 200 can store still or moving image data obtained by the photoelectric conversion device 1 according to this embodiment. The photoelectric conversion system 200 includes not only a device (for example, a camera) mainly intended for image capture but also a device (for example, a personal computer or a portable terminal) having an accessory image capture function.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-220531, filed Oct. 4, 2011 and 2012-195501, filed Sep. 5, 2012, which are hereby incorporated by reference herein in their entirety.

What is claimed is:

1. A photoelectric conversion device comprising:
   a member including a first surface configured to receive light, and a second surface opposite to the first surface; and
   a plurality of photoelectric conversion portions aligned inside said member in a depth direction from the first surface,
   wherein, in a region including a boundary between said member and at least one of said plurality of photoelectric conversion portions other than said photoelectric conversion portion positioned closest to the first surface, two portions which have different refractive indices and a difference in level larger than a difference in level of said photoelectric conversion portion positioned closest to the first surface are alternately arranged at a period, a ratio of the period to a wavelength of the light falling within a range from ¼ (inclusive) to 2 (inclusive).

2. The device according to claim 1, wherein the ratio falls within a range from ½ (inclusive) to 1 (inclusive).

3. The device according to claim 1, wherein the difference in level is equal to or more than 100 nm.

4. The device according to claim 1, wherein the at least one of said plurality of photoelectric conversion portions other than said photoelectric conversion portion positioned closest to the first surface includes the two portions on a boundary surface thereof with said member on a side of the first surface, of boundary surfaces thereof with said member on the side of the first surface and on a side of the second surface.

5. The device according to claim 1, wherein, of said plurality of photoelectric conversion portions, said photoelectric conversion portion positioned farthest from the first surface includes the two portions on a boundary surface thereof with said member.

6. The device according to claim 1, wherein the boundary surface having the two portions forms a photonic crystal.

7. The device according to claims 1, wherein
   said member is formed of silicon, and
   the boundary surface having the two portions is formed by locally irradiating the silicon with laser light.

8. The device according to claim 1, wherein a circuit for reading signals generated by said plurality of photoelectric conversion units is arranged on the second surface.

9. A photoelectric conversion system comprising:
   a photoelectric conversion device defined in claim 1; and
   a processor which processes a signal output from said photoelectric conversion device.

* * * * *